(12) United States Patent
Babel et al.

(10) Patent No.: US 6,540,565 B2
(45) Date of Patent: Apr. 1, 2003

(54) COUPLING OR PLUG FOR A CONNECTOR FOR USE IN METROLOGY, SPECIFICALLY IN ENVIRONMENTAL METROLOGY

(75) Inventors: Wolfgang Babel, Weil der Stadt (DE); Detlev Wittmer, Maulbronn (DE)

(73) Assignee: Endress & Hauser Conducta Gesellschaft fur Mess-Un Regeltechnik GmbH & Co., Gerlingen (DE)

( * ) Notice: Subject to any disclaimer, the term of this patent is extended or adjusted under 35 U.S.C. 154(b) by 0 days.

(21) Appl. No.: 09/792,470

(22) Filed: Feb. 23, 2001

(65) Prior Publication Data

US 2002/0028607 A1 Mar. 7, 2002

(30) Foreign Application Priority Data

Feb. 25, 2000 (DE) .......................... 100 08 885

(51) Int. Cl.⁷ .............................................. H01R 13/64
(52) U.S. Cl. ....................... 439/680; 439/283
(58) Field of Search ................. 439/680, 681, 439/677, 320, 321, 322, 323, 278, 283, 587, 588, 589

(56) References Cited

U.S. PATENT DOCUMENTS

| 4,198,110 A | * | 4/1980 | Wetmore et al. ............ 439/321 |
| 4,443,052 A | * | 4/1984 | Eaby et al. ................. 439/322 |
| 4,820,204 A | * | 4/1989 | Batty ......................... 439/681 |
| 5,395,246 A |   | 3/1995 | Punako et al. .............. 439/680 |

FOREIGN PATENT DOCUMENTS

| DE | 197 37 321 | 3/1998 |
| DE | 197 23 684 | 12/1998 |
| DE | 199 17 709 | 2/2000 |

OTHER PUBLICATIONS

Schwere Steckverbinder, Catalog No. 101.3, Odu–Steckverbindungssysteme GmbH & Co. KG.

* cited by examiner

Primary Examiner—P. Austin Bradley
Assistant Examiner—Ross Gushi
(74) Attorney, Agent, or Firm—Young & Basile, PC

(57) ABSTRACT

A connector for use in metrology, in particular, in environmental metrology is described. The connector is fitted with a coupling and a plug. A housing on the plug and a housing on the coupling are provided with a key and a channel on their inner surfaces or outer surfaces respectively.

12 Claims, 3 Drawing Sheets

COUPLING OR PLUG FOR A CONNECTOR FOR USE IN METROLOGY, SPECIFICALLY IN ENVIRONMENTAL METROLOGY

BACKGROUND

The invention relates to a coupling or a plug for a connector for use in metrology, specifically in environmental metrology, with a contact receptacle which is enclosed in a housing. The invention also relates to a matching connector for use in metrology, specifically in environmental metrology, with a coupling and a plug.

A coupling of this type or a plug of this type is known from German patent application 197 23 684. The connector described therein is intended preferably for use in metrology and environmental technology. A requirement for the connector is that it has to be easy to manufacture, be as durable as possible and, above all, simple for a user to operate.

The object of the invention is to create a connector of this type, which is further improved with respect to manufacture, durability and/or use.

SUMMARY

This object is met according to the invention through a coupling or a plug in that the housing for the coupling is furnished on its inner surface, outer surface and/or face with a projection which is assigned to a recess in a plug, and that the housing for the plug is provided on its inner surface, outer surface and/or face with a recess which is assigned to a projection on a coupling.

What is achieved as a result of the disposition of the projection and the recess is that the coupling and the plug can only be connected in a specified rotational position. This ensures correct alignment of the individual contacts in the coupling and in the plug to each other. Operation of the connector is thereby made considerably easier for the user.

What is also achieved as a result of the configuration of the projection and the recess on the two housings is that when the two components are inserted into each other, resulting stresses do not negatively affect the current or voltage-carrying components of the connector. Instead, the stresses act on only the two housings, which does not result in any deterioration in the electrical properties of the connector. This increases the durability of the plug according to the invention, or the coupling according to the invention, respectively.

In addition, the projection and the recess can be produced especially easily and inexpensively, so that an improvement is achieved even in this regard in the case of the connector according to the invention. It is particularly advantageous if the housing is produced from a hard plastic, specifically from polyphenylene sulphide (PPS). This results in any type of stress being absorbed and distributed by the hard plastic of the housing. In particular, pressure or shear forces, which can be created when the projection is inserted into the recess, have no negative affects on the connector because of the hard plastic. In particular, this ensures that the electrical properties of the connector always remain unchanged.

Furthermore, it is particularly advantageous if the contact receptacle consists of an electrically insulating and flexible plastic, specifically of polyfluoralkoxypolymer (PFA). Even if this material is not particularly hard, the contact receptacles are not exposed to any damage, in particular, when the coupling and the plug are connected. As a result of the disposition of the projection and of the recess on the housings of the coupling and the plug, any stresses are absorbed by the housings and, therefore, have no effect on the contact receptacles.

It is also particularly advantageous if a key is provided as a projection and a channel is provided as a recess, which are matched to each other. It is clear that the key and the channel can be assigned at discretion to either the plug or to the coupling, as well as to either the outer or inner surfaces of these components.

In an advantageous further embodiment of the invention, the contact receptacles are additionally provided with a second key and with a second channel. In this way a further alignment of the contacts of the plug and the coupling to each other is achieved. It is clear that the key and the channel can be assigned at discretion to the contact receptacles of the coupling and of the plug.

It is particularly advantageous if the keys and the channels in the housings and in the contact receptacles are designed in such a way that the key and the channel in the housings engage first, and only then do the key and the channel in the contact receptacles engage. This ensures that the actual alignment of the contacts in the coupling and in the plug is made through the key and the channel in the housings, and not through the key and the channel in the contact receptacles. This ensures that the contact receptacles are not damaged as a result of incorrectly inserting the plug into the coupling. Only following alignment of the key and the channel in the housing can the key and the channel in the contact receptacles be inserted into each other. At this point, the key and the channel in the contact receptacles are already automatically correctly aligned to each other by the key and the channel in the housings.

Additional features, potential applications and advantages of the invention will be apparent from the ensuing description of practical examples of the invention which are shown in the figures of the drawing. All the properties described or depicted alone or combined in whole or part constitute the subject of the invention, independently of their summary in the patent claims or the retroactive references made therein, and independently of their formulation in the description or representation in the drawing.

DETAILED DESCRIPTION

FIGS. 1 to 4 show a connector which can be made up of a coupling 10 and a plug 30. The connector is a fluid-tight design and can be used in metrology, for example, especially in environmental metrology. It is clear that the connector in the ensuing description can also be used independently of the aforementioned fluid-tight properties.

With the connector, a cable can be attached to a sensor, for example. In this instance, the cable is connected to the coupling 10 and the sensor is connected to the plug 30. It is clear that the properties of the plug 30 described hereafter can also be provided in the case of a coupling. In the same way, the properties of the coupling 10 described hereafter can also be provided in the case of a plug. To this extent, the connector can also be provided for the purpose of connecting two cables together. It is likewise possible that a sensor can be attached to the plug and a cable to the coupling.

Figure 1:
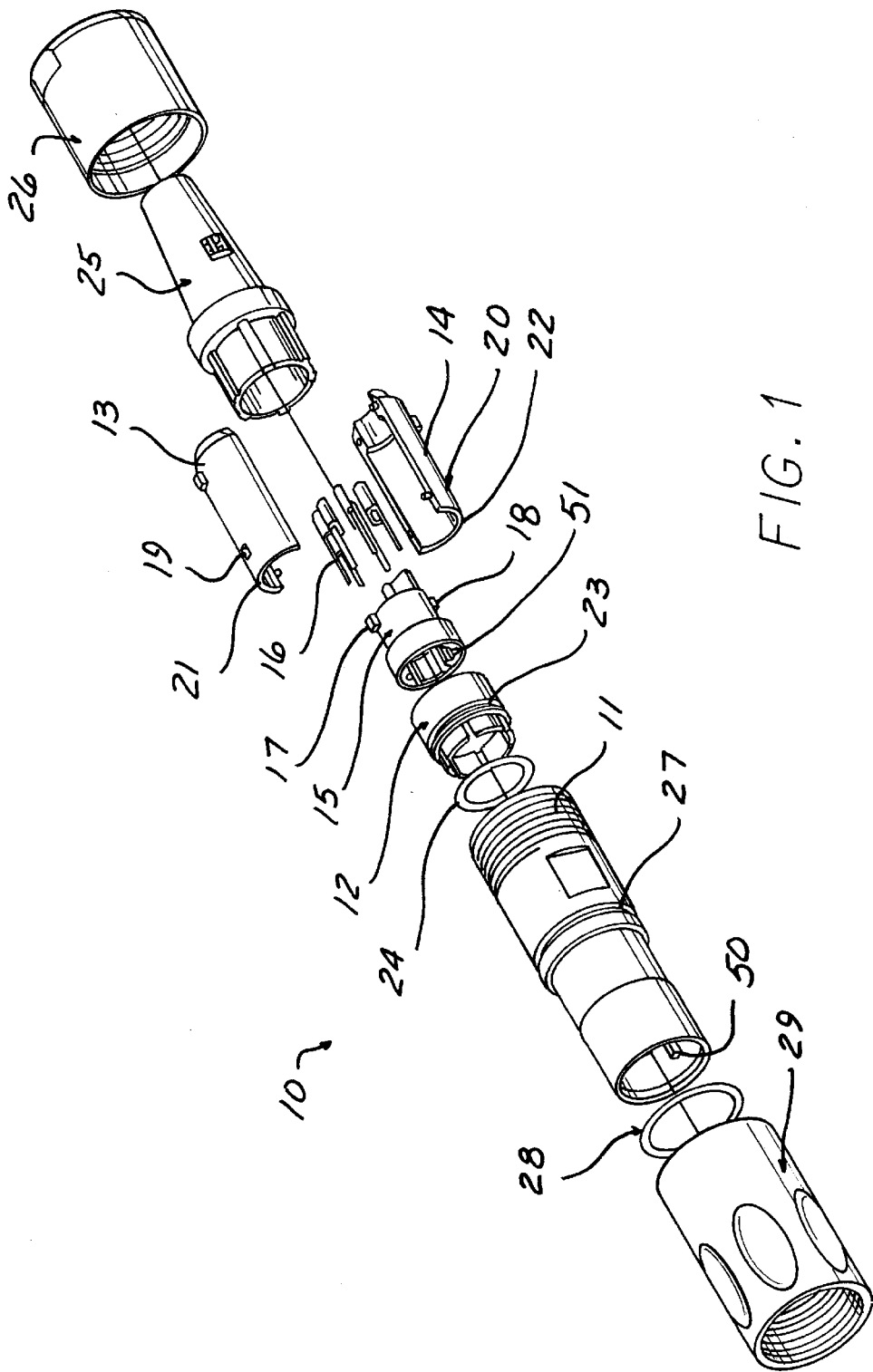
FIG. 1 is a schematic perspective representation of a practical example of a coupling according to the invention.
Figure 2:
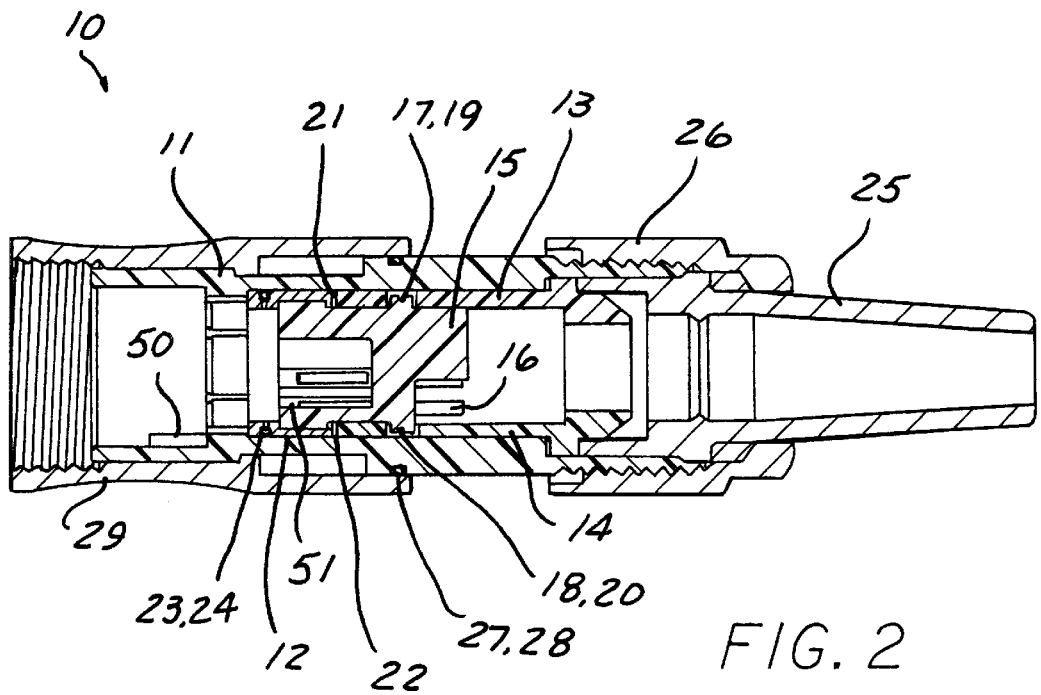
FIG. 2 is a schematic cross-sectional representation through the coupling in FIG. 1.

The coupling 10 is shown in FIGS. 1 and 2. The coupling 10 is provided for the purpose of attaching a cable to it. The coupling 10 has basically a rotationally symmetrical shape.

The coupling 10 has a housing 11 which accommodates a shield. The housing 11 is made from a hard plastic, for example, from polyphenylene sulphide (PPS). The shield is built up from a sleeve 12 and two half shells 13, 14. A contact receptacle 15 is installed into the sleeve 12. Contact pins 16 are located in the contact receptacle 15.

The sleeve 12 and the contact receptacle 15 are basically tubular in shape. The inside diameter of the sleeve 12 is approximately the same as the outside diameter of the contact receptacle 15. The sleeve 12 is made from electrically conductive metal. The contact receptacle 15 consists of an electrically insulating and flexible plastic, for example, of polyfluoralkoxypolymer (PFA). When the contact receptacle 15 and the sleeve 12 have been inserted into each other and pressed together, the contact receptacle 15 and the sleeve 12 lie tightly against each other. Because of the flexible plastic used, a fluid-tight connection is created between the sleeve 12 and the contact receptacle 15. Two ears 17, 18 project from opposite sides of the contact receptacle 15. An opening 19, 20 is made in each of the half shells 13, 14 which are assigned to the projecting ears 17, 18. The half shells 13, 14 have an inside radius which is the same as the outside radius of the contact receptacle 15. Thus, the half shells 13, 14 can be placed on the contact receptacle 15. The ears 17, 18 on the contact receptacle 15 engage the openings 19, 20 in the half shells 13, 14. In this way a mechanical connection exists between the contact receptacle 15 and the half shells 13, 14.

The half shells 13, 14 are made as injection molded parts from plastic, for example. At least one of the surfaces of the half shells 13, 14, for example, the outer surfaces, is given an electrically conductive coating. Similarly, the ends 21, 22 of the half shells 13, 14 facing the sleeve 12 are given an electrically conductive coating.

When the shield is in its assembled state, that is, when the contact receptacle 15 is installed into the sleeve 12, and when the half shells 13, 14 are set on the contact receptacle 15, the surfaces 21, 22 of the half shells 13, 14 lie against the sleeve 12. In this way, an electrical connection is created between the metal sleeve 12 and the half shells 13, 14 which have been given the electrically conductive coating.

The shield consisting of the sleeve 12 and the half shells 13, 14, including the contact receptacle 15 housed in it, is positioned in the housing 11. A groove 23 is provided on the outside surface of the sleeve 12, into which an O-ring 24 is installed. The O-ring 24 lies with its other side against the inside surface of the housing 11. Thus, there exists a fluid-tight connection between the sleeve 12 and the housing 11.

The open ends of the two half shells 13, 14 facing away from the sleeve 12 are inserted into a basically tubular strain relief 25. A nut 26 is installed over the strain relief 25, which can be screwed together with the housing 11. The shield, consisting of the sleeve 12 and the two half shells 13, 14, including the contact receptacle 15, is thereby firmly located in the interior of the housing 11 and sealed against fluids.

An annular groove 27, into which an O-ring 28 is installed, is provided on the outside surface of the housing 11. A threaded connector, with which the coupling 10 can be screwed together with the plug 30, is installed on the housing 13, over the O-ring 28 to be precise. The O-ring 28 prevents dirt from being deposited in the annular gap between the housing 11 and the threaded connector 29.

The housing 11 is furnished with a key 50 on its inside surface. The key 50 protrudes from the inside surface of the housing 11 as an elongated projection and has an approximately rectangular cross section. The key 50 is aligned with its longitudinal axis parallel to the longitudinal axis of the coupling 10. The key 50 is located in the area at the end of the housing 11 which faces away from the strain relief. The key 50 does not extend all the way to the end of the housing 11. The location of the key 50 can be seen particularly clearly from FIG. 1.

The key 50 can also be formed as a pin-shaped projection and therefore has no extension in the longitudinal direction.

It is additionally possible that the inside surface of the contact receptacle 15 is provided with a projecting key 51. The key 51 is then aligned in the longitudinal direction of the coupling 10, given a roughly rectangular cross section, and located at the end of the contact receptacle 15 which faces away from the strain relief 25. The key 51 can also be pin-shaped.

Figure 4:
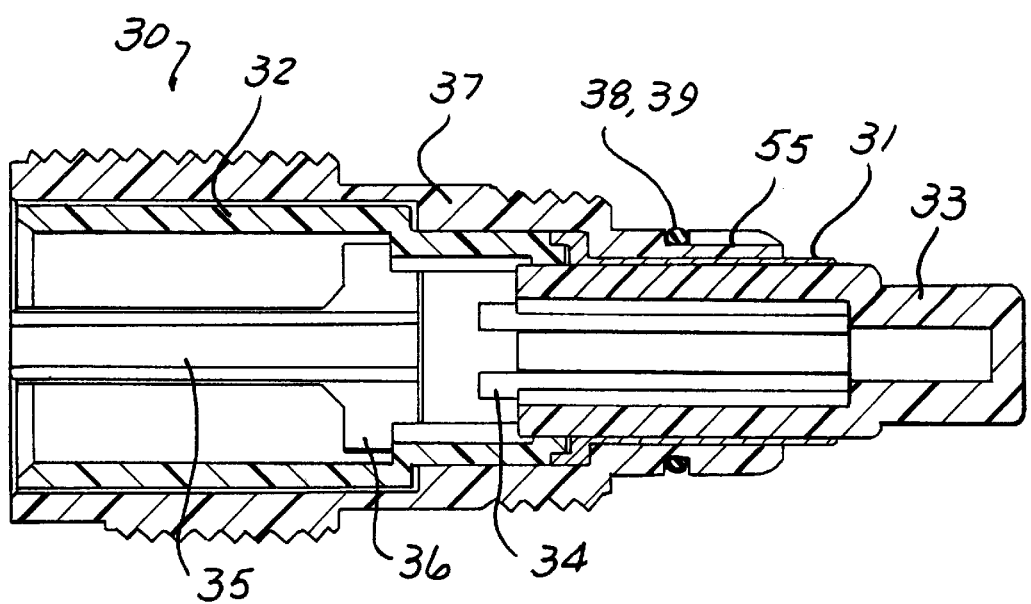
FIG. 4 is a schematic sectional representation through the plug in FIG. 3.
Figure 3:
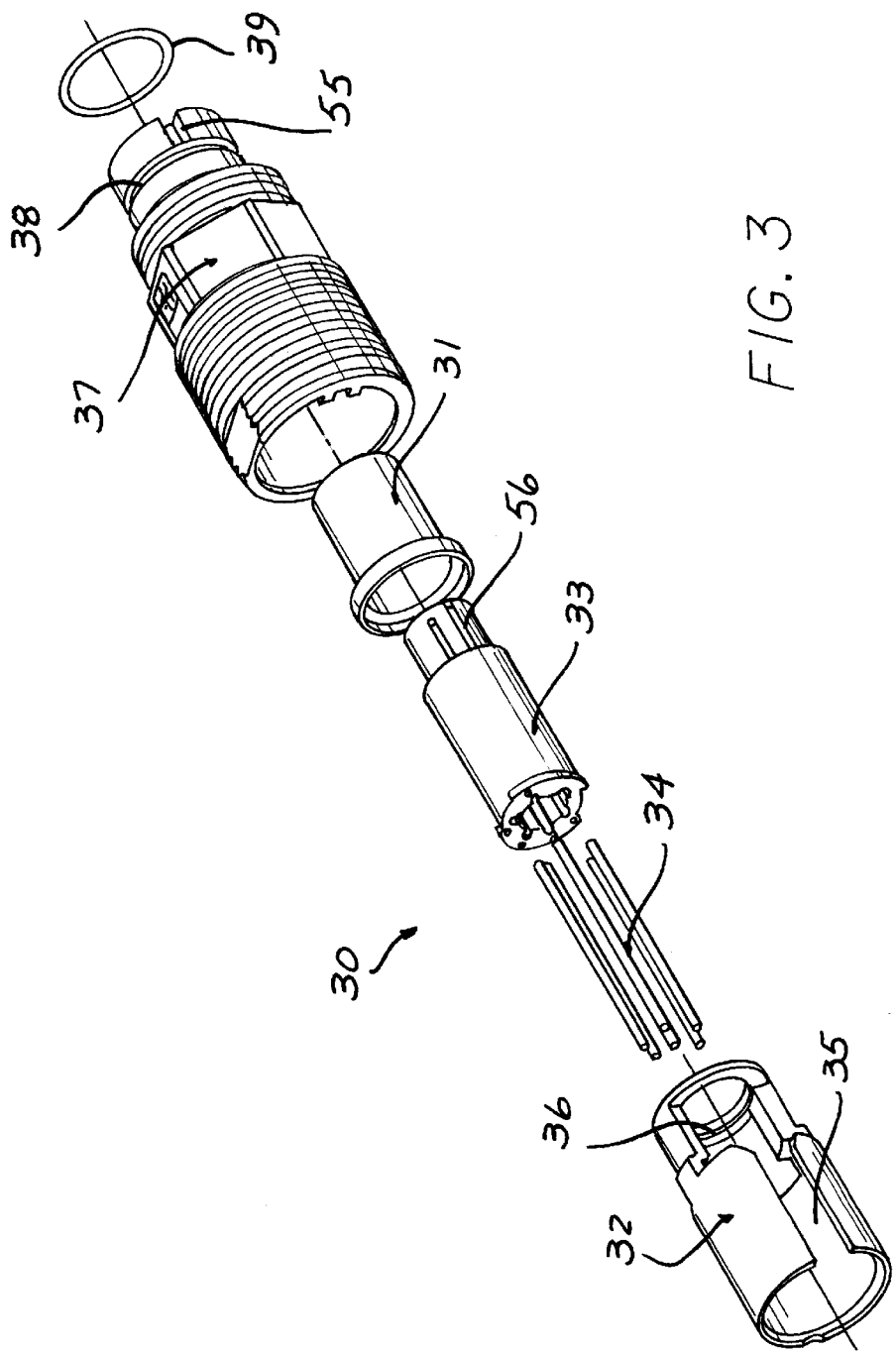
FIG. 3 is a schematic perspective representation of a practical example of a plug according to the invention.

The plug 30 is shown in FIGS. 3 and 4. The plug 30 is provided in order to be connected to a sensor or similar. The plug 30 is basically rotationally symmetrical in shape.

The plug 30 has a shield which consists of a first sleeve 31 and a second sleeve 32. The first sleeve 31 has an inner diameter at the open end facing the second sleeve 32 which matches the outer diameter of the facing open end of the second sleeve 32. The first sleeve 31 and the second sleeve 32 are pressed together at their open ends which are facing each other. Consequently, there is a firm mechanical connection between the first sleeve 31 and the second sleeve 32.

The first sleeve 31 is tubular in shape. A contact receptacle 33 is positioned inside the first sleeve 31. The contact receptacle 33 serves to locate the contact pins 34.

The first sleeve 31 is produced, for example, as a turned part from an electrically conductive metal. The second sleeve 32 is an injection-molded piece produced from plastic. The exterior surface of the second sleeve 32 is given an electrically conductive coating. The second sleeve 32 has a slot 35 oriented in the longitudinal direction. Furthermore, the second sleeve 32 is furnished with at least one window 36.

As a result of the first sleeve 31 being pressed together with the second sleeve 32, the two sleeves 31, 32 are electrically connected to each other. The aforementioned shield results from this overall arrangement.

The contact receptacle 33 is produced from an electrically insulating and flexible plastic, for example, from polyfluoralkoxypolymer (PFA). The outer diameter of the contact receptacle 33 matches more or less the inner diameter of the first sleeve 31. Thereby, the contact receptacle 33 lies tightly against the first sleeve 31. Because of the flexible plastic that is used, a fluid-tight connection results between the contact receptacle 33 and the first sleeve 31.

The longitudinal slot 35 is provided to connect the coupling 30 to the sensor. For example, it is possible that a glass tube from the sensor is pushed into the sleeve 32. The slot 35 allows tolerances in the diameter of the glass tube to be compensated for in order to ensure secure clamping. Alternatively, or in addition, the glass tube from the sensor can be adhesively bonded to the sleeve 32, where the slot 35 then permits filling with adhesive.

The window 36 in the sleeve 32 is provided so that the wires from the sensor can be electrically connected to the contact pins 34 on the contact receptacle 33. For this purpose, it is possible that the wires from the sensor are soldered to the contact pins 34 through the window, or windows 36, respectively.

The shield consisting of the first sleeve 31 and the second sleeve 32, including the contact receptacle 33 enclosed inside it, is encased in a housing 37. The housing 37 is produced from a hard plastic, for example, from polyphenylene sulphide (PPS). An annular groove 38, into which an O-ring is installed, is provided on the outer surface of the housing 37 facing away from the second sleeve 32.

On the outer surface of the housing 37 there is a channel 55. The channel 55 is aligned in the longitudinal direction of the plug 30. The channel 55 extends from the end of the housing 37 facing away from the second sleeve 32 as far as the annular groove 38 for the O-ring 39. The cross section of the channel 55 matches the cross section of the key 50. The same applies to the length of the channel 55. The location of the channel 55 can be seen particularly clearly from FIG. 3.

Thus, the coupling 10 with the key 50 can be inserted into the channel 55 on the plug 30. The key 50 extends only as far as the O-ring 39 located in the annular channel, so that the seal provided by the O-ring 39 is not affected by the key/channel connection.

It is additionally possible that the outer surface of the contact receptacle 33 is furnished with a channel 56. The channel 56 is aligned in the longitudinal direction of the plug 30 and matched with respect to its cross section and its length to the key 51.

Thus, the coupling 10 with the key 51 can be inserted into the channel 56 of the plug 30. Through the disposition of the keys 50, 51 and the channels 55, 56, it can be provided that the key 50 engages the channel 55 first, and only afterwards can the key 51 engage the channel 56. The consequence of this is that when an operator inserts the key 50 into the channel 55, the coupling 10 is aligned to the plug 30 so that the key 51 is automatically guided into the channel 56 because of the pre-existing alignment.

The housing 37 is provided with an external thread unto which the threaded connector 29 of the plug 10 can be screwed. The threaded connector 29 is positioned over the O-ring 39 in its tightened position. In this way there is a fluid-tight connection between the threaded connector 29 and the housing 37.

The coupling is produced, for example, in the following way: First, the contact pins 16 are pushed into the contact receptacle 15, and the contact receptacle 15 is pressed into the sleeve 12. Then, the cable to be connected is pushed through the strain relief 25 and the nut 26. The wires from the cable can be soldered to the contact pins 16. Next, the two half shells 13, 14 are set on the contact receptacle 15. The contact receptacle 15 together with the contact pins 16 and the soldered wires from the cable are thus located inside the shield consisting of the sleeve 12 and the two half shells 13, 14. One end of this shield is now inserted into the strain relief 25 along with the open ends of the two half shells 13, 14, and the other end is pushed into the housing 11 with the sleeve 12. The O-ring 24 is pulled onto the sleeve 12 beforehand. The nut 26 is now threaded onto the external thread of the housing 11. Finally, the O-ring 28 is installed into the annular groove 27, and the threaded connector 29 is positioned onto the housing 11.

The plug can be produced in the following way, for example: First, the contact pins 34 are inserted into the contact receptacle 33. Then the contact receptacle 33 is inserted into the first sleeve 31. Next, the first sleeve 31 is pressed together with the second sleeve 32. The planned sensor can now be inserted into the second sleeve 32. The contact wires from the installed sensor can be soldered to the contact pins 34 through the windows 36 in the second sleeve 32. Now the shield consisting of the first and the second sleeve 31, 32 including the contact receptacle 33 housed inside it, with the contact pins 34 and the contact wires from the sensor soldered to them is pushed into the housing 37 and bonded if necessary. The O-ring is installed into the annular groove 38 in the housing 37.

To connect the plug 30 and the coupling 10, the free end of the plug with the O-ring is inserted into the threaded connector 29 of the coupling 10. The key 50 of the coupling 10 is aligned by the operator with the channel 55 on the plug 30 and then inserted into it. Where used, the key 51 on the coupling 10 is also inserted into the channel 56 on the plug 30. This can be done without any further alignment on the part of the operator because of the alignment already created by the key 50 in the channel 55. The plug 30 and the coupling 10 are then tightened together by means of the threaded connector 29.

In a secondary configuration, it is possible to provide a projection on the face of the housing 11 for the coupling 10 instead of the key 50 and the channel 55, assigned to a recess in the face of the housing 37 for the plug 30. It is clear that conversely the projection and the recess can be formed on the plug 30 and the coupling 10.

What is claimed is:

1. A connector for use in metrology comprising:
   a coupling including a housing and a contact receptacle positionable in the housing;
   a plug including a housing and a contact receptacle positionable in the housing of the plug, the plug engageable with the coupling;
   means for aligning the housings of the coupling and the plug when the coupling and the plug are engaged including a first key disposed on the housing of the coupling and a first channel disposed on the housing of the plug;
   means for aligning the contact receptacles of the coupling and the plug when the coupling and the plug are engaged including a second key disposed on the contact receptacle of the coupling and a second channel disposed on the contact receptacle of the plug, where the first key and the first channel of the housings aligning means engage before the second key and the second channel of the contact receptacle aligning means engage when the coupling and the plug are urged together; and
   means for sealing the coupling with respect to the plug when the coupling and the plug are engaged.

2. The connector of claim 1 wherein the key is disposed on one of an inner surface, an outer surface and a face of the housing of the coupling.

3. The connector of claim 1 wherein the housing of the coupling is manufactured from a hard plastic.

4. The coupling in accordance with claim 3 wherein the hard plastic is polyphenylene sulphide.

5. The connector of claim 1 wherein the contact receptacle of the coupling is made from electrically insulating, flexible plastic.

6. The coupling in accordance with claim 5 in which the plastic is polyfluoralkoxypolymer.

7. The coupling in accordance with claim 1 wherein the second key and the second channel are matched to each other.

8. The coupling in accordance with claim 1 wherein the key and the channel are aligned in the longitudinal direction.

9. The connector of claim 1 wherein the housing of the plug is formed of a hard plastic.

10. The connector in accordance with claim 9 in which the hard plastic is polyphenylene sulphide.

11. The connector of claim 1 wherein the contact receptacle of the plug is formed of electrically insulating, flexible plastic.

12. The connector in accordance with claim 11 in which the plastic is polyfluoralkoxypolymer.

\* \* \* \* \*